United States Patent [19]
West et al.

[11] Patent Number: 6,064,948
[45] Date of Patent: May 16, 2000

[54] TESTER SYSTEMS

[75] Inventors: Michael S. West; Archer R. Lawrence; Paul R. Hunter; Jack C. Little, all of Austin, Tex.

[73] Assignee: Tanisys Technology, Inc., Austin, Tex.

[21] Appl. No.: 09/033,364

[22] Filed: Mar. 2, 1998

[51] Int. Cl.$^7$ .................................................. G01R 31/26
[52] U.S. Cl. ............................................ 702/119; 702/66
[58] Field of Search ............................. 702/119, 66, 67; 364/712; 395/800.32, 800.35; 714/37, 39, 40

[56] References Cited

U.S. PATENT DOCUMENTS

| | | | |
|---|---|---|---|
| 4,540,895 | 9/1985 | Takeda | 307/252 |
| 4,796,259 | 1/1989 | Troy | 371/20 |
| 4,827,437 | 5/1989 | Blanton | 364/571.01 |
| 4,977,514 | 12/1990 | Bush | 364/487 |
| 5,001,714 | 3/1991 | Stark et al. | 364/487 |
| 5,020,011 | 5/1991 | Stark et al. | 364/580 |
| 5,039,937 | 8/1991 | Mandt et al. | 324/131 |
| 5,043,987 | 8/1991 | Stark et al. | 371/26 |
| 5,204,969 | 4/1993 | Capps et al. | 395/800 |
| 5,325,309 | 6/1994 | Halaviati et al. | 364/488 |
| 5,371,851 | 12/1994 | Pieper et al. | 395/164 |
| 5,434,805 | 7/1995 | Iwasaki | 364/580 |
| 5,535,405 | 7/1996 | Byers et al. | 395/800 |
| 5,553,213 | 9/1996 | Sano | 395/140 |
| 5,748,642 | 5/1998 | Lesmeister | 371/22.1 |
| 5,801,972 | 9/1998 | Konno | 364/579 |
| 5,862,063 | 1/1999 | Thome et al. | 364/723 |
| 5,930,735 | 7/1999 | Pun | 702/119 |

*Primary Examiner*—Timothy P. Callahan
*Assistant Examiner*—Linh Nguyen
*Attorney, Agent, or Firm*—Baker Botts L.L.P.

[57] ABSTRACT

A tester for use with a device under test includes a processor, a signal timing editor to create representations of signal waveforms and associated times, and a test program executable on the processor that schedules events based on information from the signal timing editor. The test program schedules different delays for the events to compensate for variations in time delays between different signals coupled to the device under test.

26 Claims, 12 Drawing Sheets

TABLE 1

| EVENT | LATENCY (IN CLOCK CYCLES) |
|---|---|
| WRITE | 1 |
| UPDATE | 2 |
| LOAD | 3 |
| EXCEPTION | 4 |

Figure 14

TESTER SYSTEMS

BACKGROUND

The invention relates to tester systems.

Tester systems for electronic devices (for example, integrated circuit devices such as memory devices, microcontrollers, and microprocessors) have increasingly become more sophisticated as the electronic devices themselves become more complex. In addition to complexity of functionality, the speeds at which electronic devices can operate have also increased dramatically.

One type of electronic device is the memory device, including dynamic random access memories (DRAMS), synchronous DRAMs (SDRAMs), static RAMs (SRAMs), and other memory products. It is not uncommon for these memory devices to run at frequencies at or greater than 100 MHz.

To test at such high frequencies, tester systems include a clock running at or above the maximum frequency at which devices can be tested. However, as clock frequencies increase, factors such as skewing, signal line delays, and gate propagation delays become significant. In addition, because of the different paths of signals to and from a device under test, there may be variations in skewing, signal line delay, and gate propagation delay between signals of the device under test. To compensate for such variations, some tester systems, such as production-oriented automatic test equipment (ATE) testers, use very high frequency clocks (some as high as 500 MHz) to provide very fine resolutions. In these systems, during tester start-up, variations in signal paths can be calibrated by adjusting signal path timings. Such testers, however, require sophisticated internal circuitry and signal paths to operate at the desired high frequencies, which can result in a very high cost system.

SUMMARY

Generally, the invention is directed to a tester system having a test program that compensates for variations in timings of signals associated with a device under test.

In general, in one aspect, the invention features a tester for use with a device under test that includes a processor and a signal timing editor to create representations of signal waveforms and associated times. In addition, a test program executable on the processor schedules events based on information from the signal timing editor. The test program schedules different delays for the events to compensate for variations in time delays between different signals coupled to the device under test.

Other features will become apparent from the following description and from the claims.

DETAILED DESCRIPTION

Figure 1:
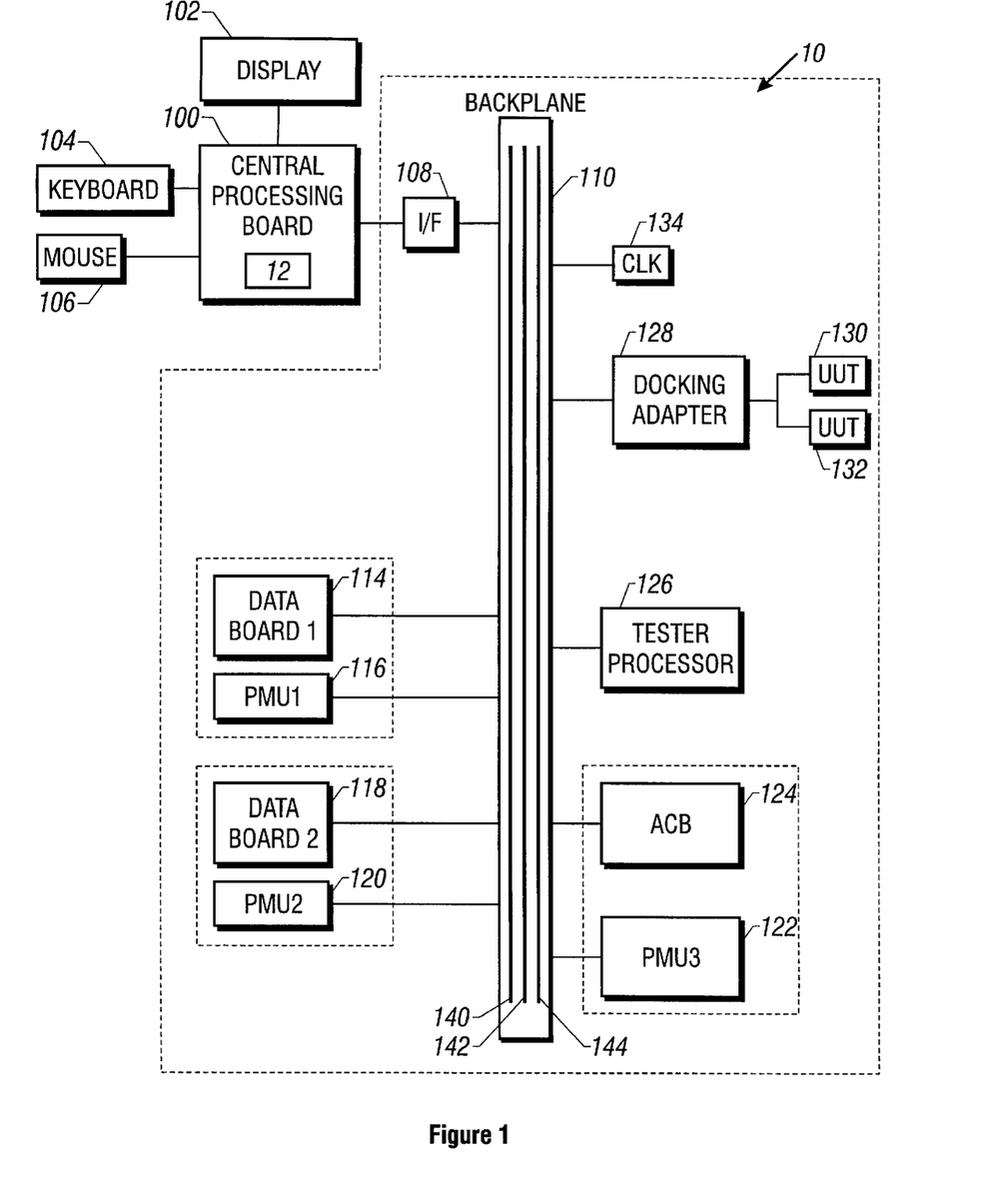
FIG. 1 is a block diagram of a tester system incorporating a main test program according to an embodiment of the invention.

Referring to FIG. 1, a tester system 10 includes a host system 100, which can be a main processor board 100 such as an embedded processor or a microprocessor-based circuit board. The main processor board 100 includes storage media as well as a processing element in which a main test application program 12 according to an embodiment of the invention can be stored and executed. The main processor board 100 also includes ports for connection to a video display 102, a keyboard 104, a mouse device 106 (or other suitable pointer device), and other external devices.

Alternatively, the host system 100 can include a stand-alone system (or system connected to a network). Such external systems can be connected to the tester system 10 by suitable connections.

Generally, the main test application program 12 includes several components (which are described in detail below): a graphical editor program that displays a waveform editor on the video display 102; a code generator program, which converts data received from the waveform editor into instructions presented to other parts of the tester system 10; and a database program that defines the framework under which the editor program and code generator program communicate.

In the following description, the hardware components of the tester system 10 are referred to and described as general functional blocks. For a more detailed description of these general blocks, reference is made to the following applications, each filed concurrently herewith and each incorporated by reference:

U.S. patent application Ser. No. 09/032,961, entitled "Programmable Pulse Generator";

U.S. patent application Ser. No. 09/032,958, which has issued as U.S. Pat. No. 5,956,280 to Lawrence, on Sep. 21, 1999. entitled "Contact Test Method and System for Memory Testers";

U.S. patent application Ser. No. 09/033,285, entitled "Parametric Test System and Method"; and U.S. patent application Ser. No. 09/033,363, entitled "Microsequencer Method and System".

The main processor board 100 is coupled through an interface unit 108 to a backplane 110 of the tester system 10.

The backplane 110 includes various buses (e.g., data bus 140, address bus 142, control bus 144) as well as slots for connection to various boards, including a docking adapter board 128 for connection to one or more units under test (UUTS) 130 and 132. The docking adapter 128 may include signal drivers to transmit signals to and receive signals from the units under test 130, 132.

Figure 5:
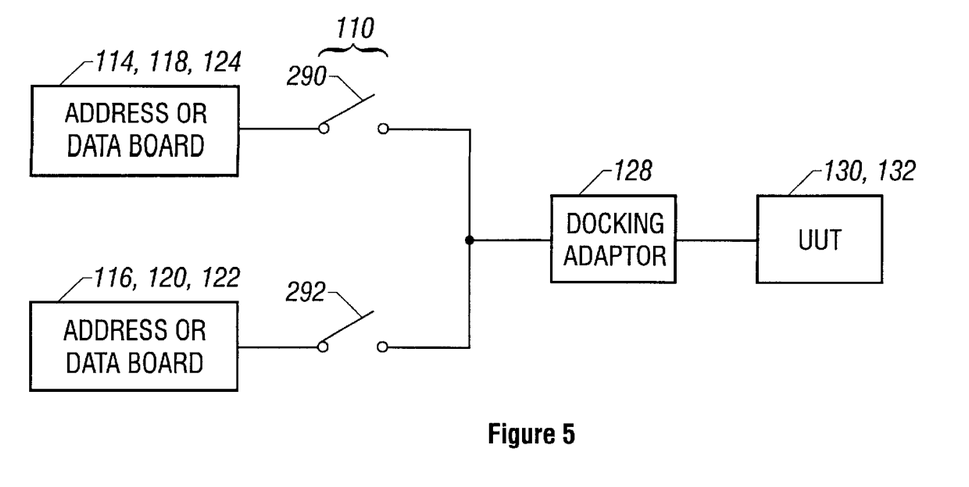
FIG. 5 is a block diagram of switches connecting the address control board and data boards to the backplane in the tester system.

The backplane 110 also includes blots for receiving one or more data boards 114, 118 and corresponding parametric measurement unit (PMU) boards 116, 120. Due to signal loading requirements, multiple sets of analog switches 290 and 292 (FIG. 5) are included in the backplane 110 to selectively connect one of the data board and PMU in each data board/PMU pair.

The backplane 110 also includes a clock generator 134 that distributes clocks to the various components of the tester system 10. The clocks for all the devices connected to the backplane 110 can run at the same frequency. Alternatively, different devices on the backplane 110 can be run at different frequencies. For example, the UUTs 130, 132 can be run at twice the frequency of the backplane clock by using both phases of the backplane clock. This allows for higher frequency testing. Portions of the data boards 114, 118 can also be run at the higher frequency to ensure that data signals are provided at the proper resolution.

Also connected to a backplane slot is an address control board (ACB) 124 and its associated PMU 122. A set of analog switches 290 and 292 (FIG. 5) are provided to selectively connect one of the ACB 124 and PMU 122.

Although certain of the functions of the tester system are described as being implemented discretely in separate data boards and an address and control board, other hardware configurations to implement the tester functions can also be used.

A tester processor 126 is connected to another slot of the backplane 110. The tester processor 126 is the main controller that synchronizes communication between the host system 100 and the other components of the backplane 110. The tester processor 126 receives command packets from the host system 100 and sends status and data back to the host. Received command packets are converted to a format understood by the data boards and ACB. An exemplary tester processor 126 is the SA-110 general purpose 32-bit RISC microprocessor from Digital Equipment Corporation.

The tester processor board 126 has sockets for connection to a memory module (which can include dynamic random access memory or DRAM devices and non-volatile memory such as flash read-only-memories or ROMs). Instructions and data generated by the host system 100 are stored in the memory of the tester processor 126.

The PMU boards 116, 120, and 122, which are associated with the data board 114, data board 118, and the ACB 124, respectively, perform various measurements on signals received from the one or more UUTs 130, 132. Measurements include, for example, current leakage measurements, output signal voltage measurements, and other analog measurements.

Figure 2:
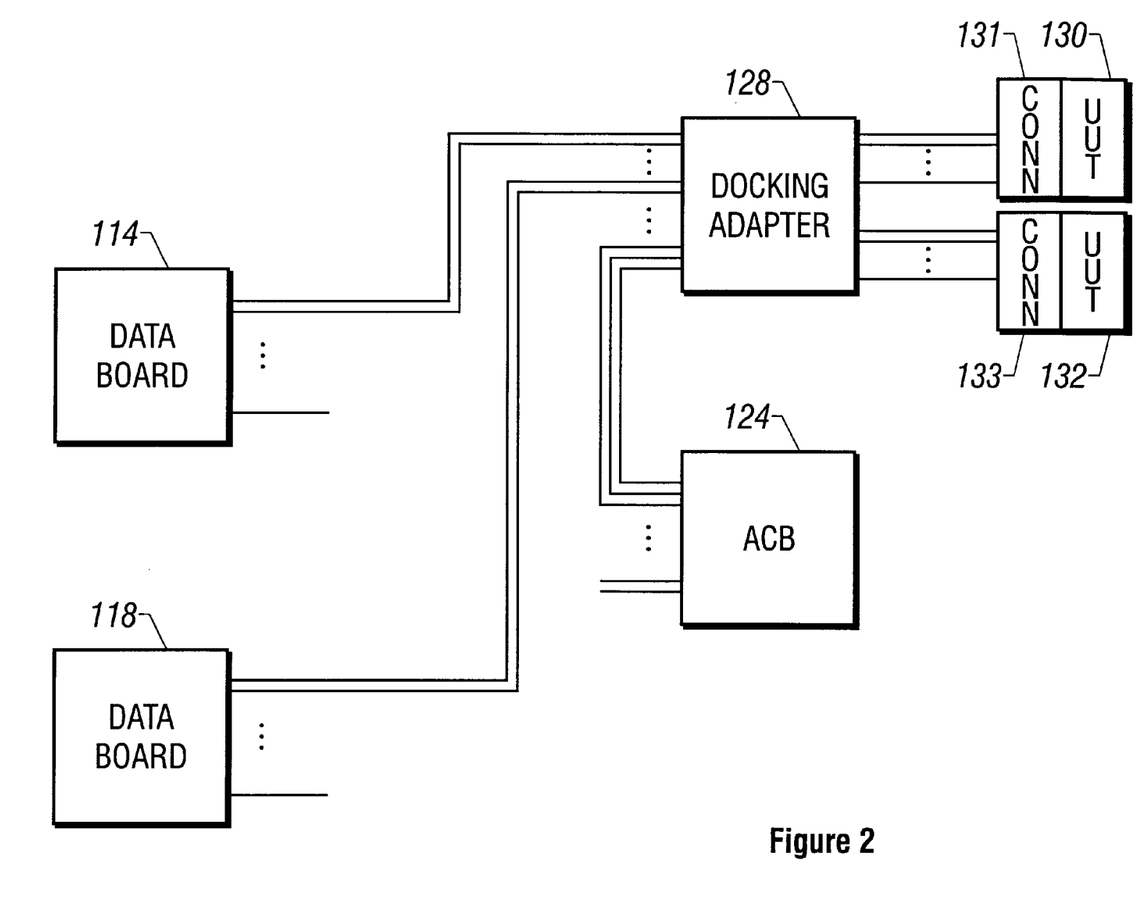
FIG. 2 is a block diagram illustrating signal paths between components in the tester system.

Referring to FIG. 2, the general wiring scheme of the different devices on the backplane 110 is shown. Signal paths extend from the data boards 114, 118 and from the ACB 124 to the docking adapter 128, which in turn is coupled to the UUTs 130, 132 through connectors 131, 133. Variations in timings of signals between the ACB 124 and the docking adapter 128 are compensated using the main test program 12 according to an embodiment of the invention.

Other variations in timing are managed both by the ACB 124, which provides some control signals to the data boards 114 and 118, and by calibration data stored in memory devices on one or more individual boards in the system.

Figure 3:
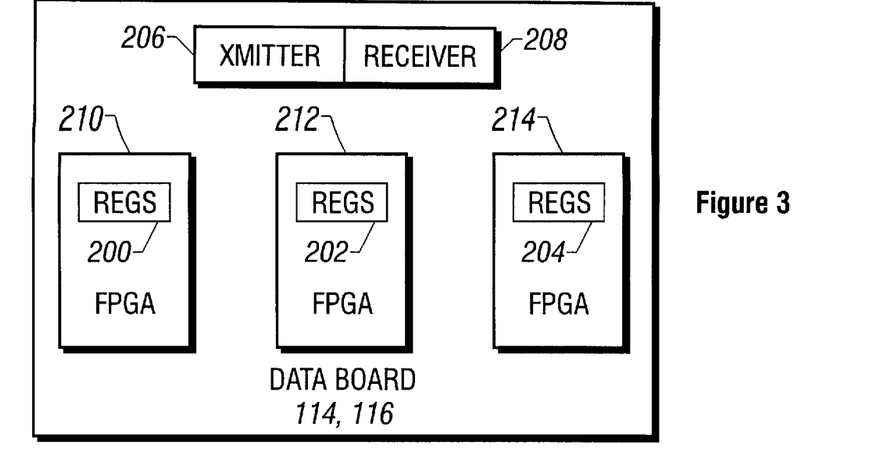
FIG. 3 is a block diagram of a data board in the tester system.

Referring to FIG. 3, each data board 114, 118 includes one or more controllers 200, 202, and 204 (which can be implemented with field programmable gate arrays or FPGAs) and transmitters 206 and receivers 208 that interface the buses 140, 142, and 144 in the backplane 110. Although FPGAs are used in one embodiment, alternative devices can be used to implement the necessary controllers, including one or more of the following: application specific integrated circuits (ASICs), programmable array logic (PAL), or discrete devices.

Each FPGA in a data board contains logic for performing data generation, data masking, and data comparison, including sets of registers 210, 212, and 214. The FPGA can include the following registers: write data registers that are loaded with the beginning data patterns during write cycles; compare data registers loaded with comparison patterns on read cycles; read data buffers that are used to receive read data, which are then compared to the comparison data in the compare data registers to check for errors; write per bit mask registers that are loaded with a predetermined mask pattern that can be used to mask certain of the write data bits in the 32-bit data pattern; read compare mask register, which is loaded with a pattern that enables read data compares of corresponding bits stored in the read data buffer; an error buffer, in which results of the comparison of the read data and the compare data is latched for reading by the tester processor 126; force data buffer, which is a buffer that is loaded with a data pattern that is forced on the data lines before and after a test data pattern on the data bus 142 on the backplane 110; and an error buffer reset register, which is set by the tester processor 126 to clear the error buffer in each FPGA in the data board 114.

Each FPGA also includes a command register that can be programmed by the tester processor 126 to perform certain functions on data stored in the data registers in the corresponding FPGA. Exemplary commands include shift commands (to shift data in the write data registers by predetermined number of bits); a random data generation command, in which a predetermined pseudo-random pattern is loaded into the data register; and the invert command, in which the data bits in the write data registers are inverted.

Figure 4:
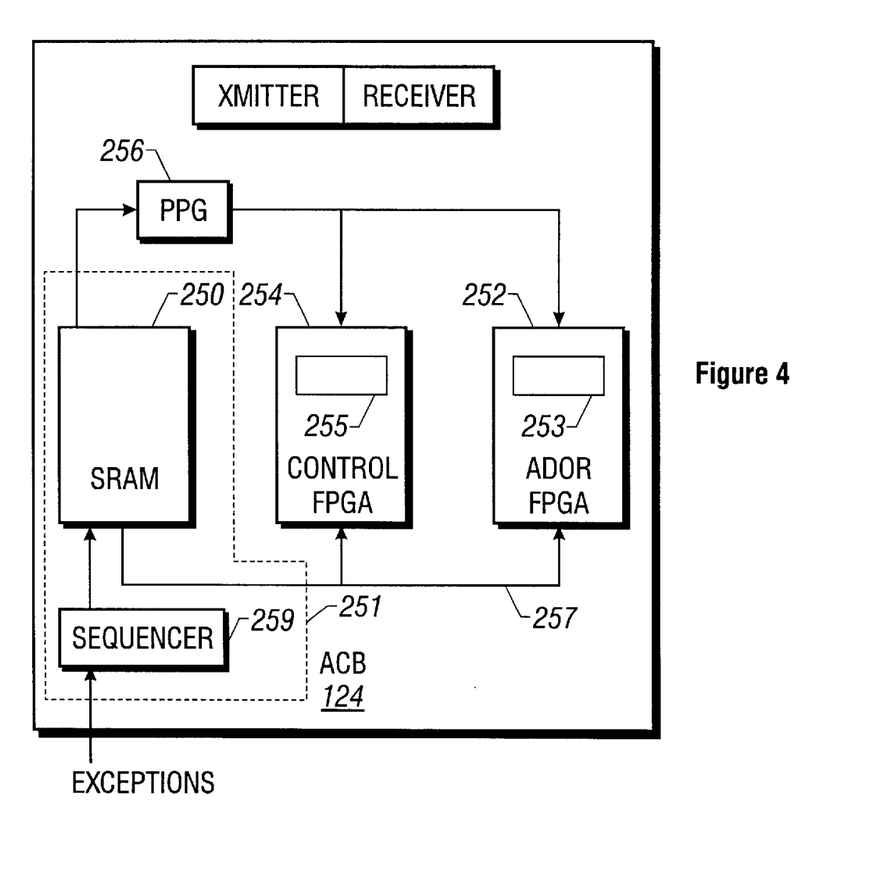
FIG. 4 is a block diagram of an address control board in the tester system.

The address and control board (ACB) 124 includes logic for generating addresses sent to the UUTs 130, 132 as well as control signals sent to the UUTs 130, 132 and the data boards 114, 118. In one embodiment, the ACB 124 also includes a microsequencer 251 that contains a memory device 250 (which can be implemented with a static random access memory or SRAM) and a sequencer 259. The memory device 250 stores instructions from the tester processor 126.

The ACB 124 can also include an address FPGA (or other suitable control device) 252 for generating addresses and a control FPGA (or other suitable control device) 254 for generating control signals. In addition, the ACB 124 includes a set of programmable pulse generators 256. The microsequencer 251 clocks the data in the memory device 250 to the control FPGA 254, the address FPGA 255, and the programmable pulse generator (PPG) 256 over a bus 192. Each of the latter elements (control FPGA, address FPGA, and PPG) is responsible for acting on some portion of the VLIW (very long instruction word) instruction stored in the memory device 250.

As explained below, according to an embodiment of the invention, the programmable pulse generators 256 are used to set the various delays of signals provided to the UUTs 130, 132. By programming appropriate delays, compensation for variations in skewing, propagation delays, and gate delays in the differnt signal paths can be made. The specific delays for individual UUT signals or groups of signals are contained in a calibration table stored in a memory in the host system 100 and/or in memory devices on the data boards 114, 118, the ACB 124, or tester processor 126. For example, different UUTs can have different input pin capacitances (because of use of different connection sockets, different wiring paths, and different device input pin characteristics). In addition, different tests (e.g., normal memory mode, page mode, nibble mode, or burst mode in DRAM or SDRAM devices) can have signal edges rising at different times. In some cases, these edges may be aligned differently with respect to the main clock depending upon the differences in when edges of UUT signals are activated or deactivated. Thus, if desired, multiple tables (or only one table) containing device- and test-specific calibration values can be stored.

Various registers 253 are included in the address FPGA 252 for storing such values as the base row address, base column address, end row address, and end column address to determine the starting and ending row and column addresses in each test. Such base and end addresses can be loaded into the ACE 124 through the VLIW instructions stored in the memory device 250.

The address FPGA 252 also includes two pseudo-random generators, one for row address generation and one for column address generation. A refresh address counter outputs the row address during refresh cycles. A force address register is loaded with a value that can be selected on the address lines to the UUTs 130, 132 before and after valid addresses from the row counter register and the column counter register. The row counter register is initially loaded with the base row address and updated by the contents of an offset register that can apply incrementing, inverting, shifting, or pseudo-random generator operations to obtain the next address. The contents of the row counter register are outputted to the address bus connected to the UUTs 130, 132. Similarly, a column counter register is initially loaded with the contents of the base column address register, and the output of the column counter register is outputted to the address bus connected to the UUTs. Address output multiplexers select which address is applied to the output buffers of the address FPGA 252, selecting between the row address, column address, refresh address, or the force address.

In the microsequencer 251, the control FPGA works in conjunction with the memory device 250 to generate appropriate control signals in response to instructions written into the memory device 250. As instruction words are fetched from the memory device 250, the control FPGA 214 toggles the appropriate control signals to the UUTs 130, 132, the address FPGA 252 provides the appropriate address signals (e.g., row and column addresses), and the data boards 114, 118 generate the appropriate data, if necessary (such as write data during a write transaction).

In an alternative configuration, separate SRAMs for the ACB and data boards can be provided. In this alternative configuration, the microsequencer would include a controller (similar to sequencer 259) connected by a bus to the different SRAMs.

The memory device 250 is loaded by the tester processor 126 in response to specific tests requested by the main test program 12 in the host system 100. A control sequence in the form of a series of stored instructions words is stored in the memory device 250, each instruction word containing test signal control information. Each instruction word also includes the next instruction address in the sequence to allow for looping and other branch sequences.

In one embodiment, instructions from the tester processor 126 are loaded in the format of a very long instruction word (VLIW) into the memory device 250 in the microsequencer 251. The commands in the VLIW are executed at the selected system clock rate (e.g., 50, 66 MHz). The memory device 250 can include space for storing multiple test routines at the same time. In one embodiment, the control FPGA 254 can generate 64 control signals to the UUTs 130, 134 (under control of the VLIW instruction).

The control FPGA 254 allows a predetermined number of timing signals going to the one or more UUTs 130, 132 to be individually enabled or disabled. An enable register 255 in the FPGA 254 is loaded to allow the timing signals to be driven or disabled. Disabled signals are individually pulled high or low, as determined by an invert register. Using the programmable pulse generators 256, the timing edges of the timing signals can be controlled individually or in groups of a certain number of signals (e.g., 4, 8).

The ACB 124 also includes a set of programmable pulse generators 256 that are provided for UUT address, data, and control signal timing control. Exemplary signals include row address bits, column address bits, refresh address bits, read/write data strobes, data output enable, write per bit enables and other control signals. Each PPG 256 can control the delay, if any, of the leading and trailing edges of groups of control signals. Thus, if compensation is required on certain signals or groups of signals, then the PPGs 256 can be programmed to add the additional delay needed.

Figure 6:
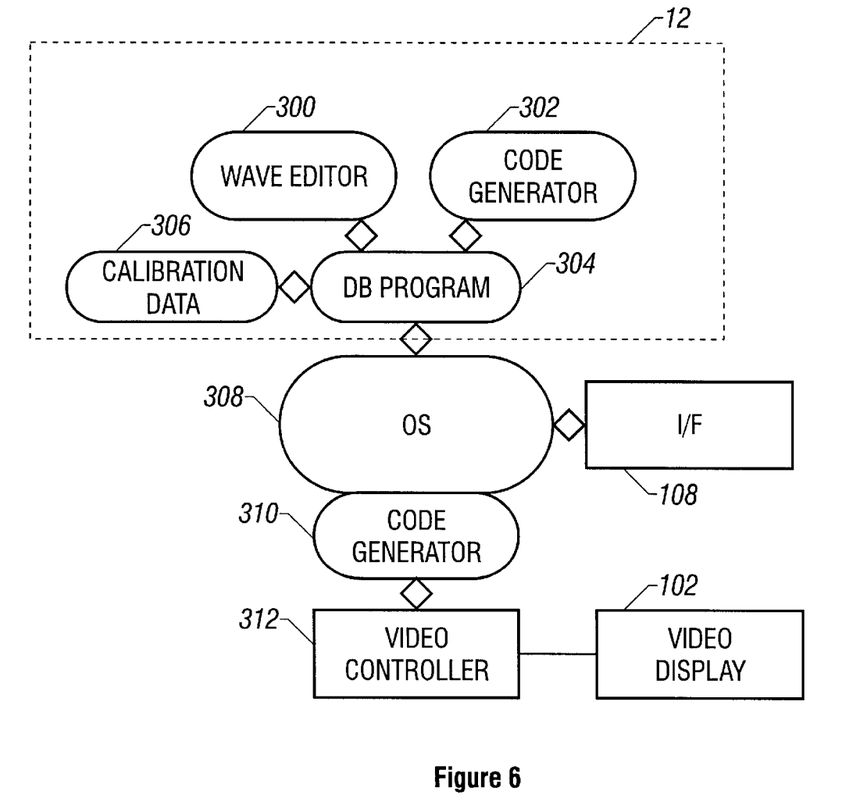
FIG. 6 is a block diagram of software layers in the tester system.

Referring to FIG. 6, certain software components in the host system 100 are illustrated, including the main test application program 12. In one embodiment, a database program 304 defines the framework through which the other software components can communicate. For example, the database program 304 can be the Access program from Microsoft Corporation. The database program 304 is connected to other applications, including a graphical or waveform editor 300 that controls a graphical user interface through which a user can enter events to control the UUTs 130, 132. As used in this application, "event" refers to waveform edges and levels and other user-specified events (e.g., load register, exception, etc.). After the waveforms have been built and other events defined in the waveform editor 300, the waveform and other event data are loaded into the database program 304 and processed by a code generator 302 to adjust signal timing edges and generation of other events as appropriate (described in more detail below). To perform the necessary time compensation, calibration data stored in one or more tables 306 in the storage medium of the host system 100 are accessible by the code generator 302 through the database program 304.

An operating system 308 provides the environment in which applications such as the database program 304, waveform editor 300, and code generator 302 can operate. The operating system 308 is associated with several device drivers, including a video device driver 310 that is associated with a video controller 312. The video controller 312, acting under control of video applications (such as the waveform editor 300), provides video data for display on the video display 102. In addition, the operating system provides an interface to the tester interface unit 108 connected to the backplane 110 of the tester system 10.

Figure 7:
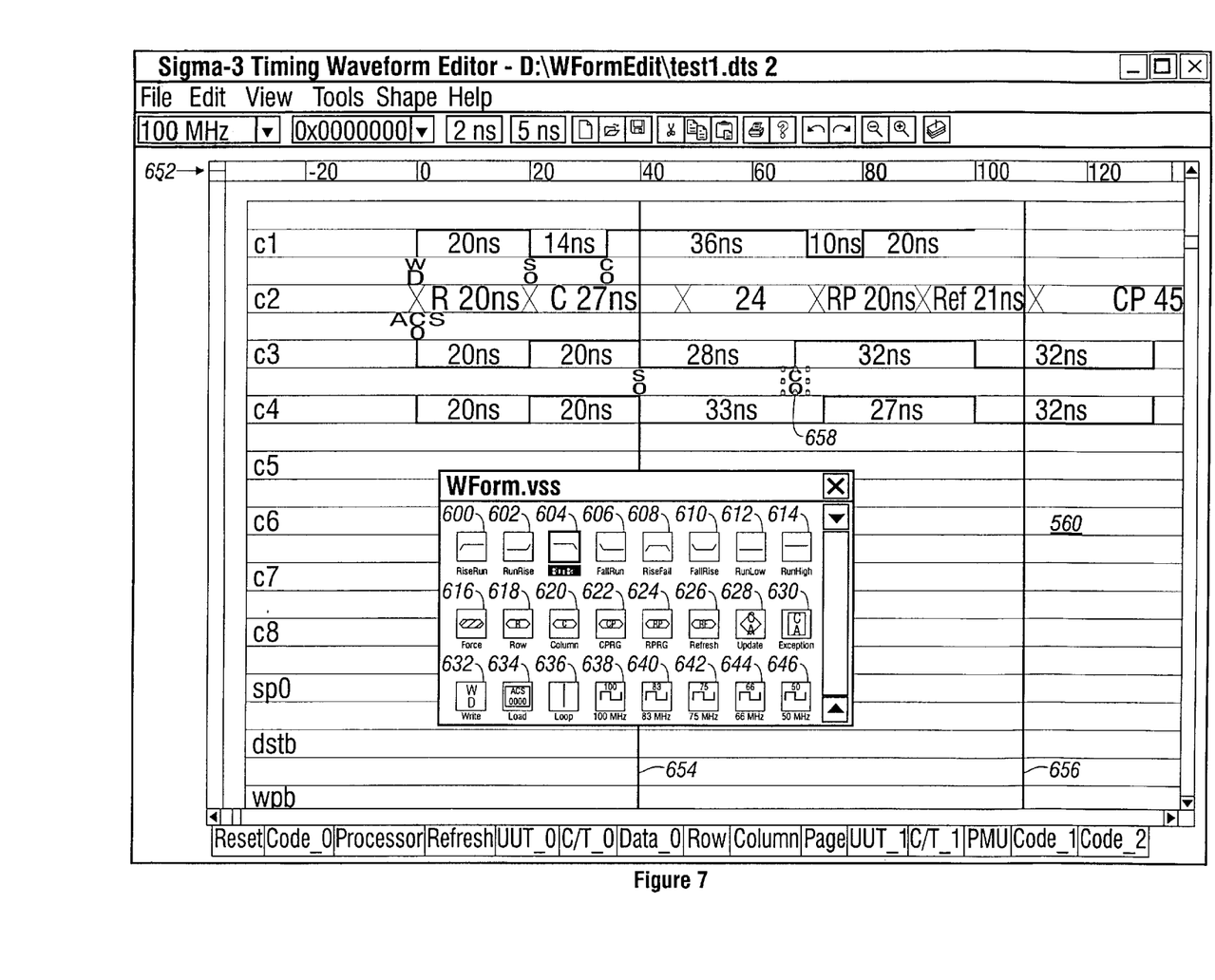
FIG. 7 is a diagram of a waveform editor used to create test waveforms in the main test program.

Referring to FIG. 7, an exemplary waveform editor window 558 includes palettes in which various waveform and other events associated with signals for the UUTs 130, 132 are shown. In the waveform display palette 560, exemplary control signal groups include C1, C2, C3, C4, C5, C6, C7, C8, ROW, COL, REF, DOE, WD, WPB, and DSTB. In one embodiment, each one of the C1–C8 signal groups can control a predetermined number (e.g., four) of address and/or control signals to the UUTs 130, 132. In addition, REF controls refresh cycle timing, DOE controls output enable signal timing, WD controls write data timing, DSTB controls data strobe timing, ROW controls row address strobe timing, and COL controls column address strobe timing. Each control signal is further separated into leading edge and trailing edge control; for example, CnL (n=1–8) controls the leading edge while CnT controls the trailing edge.

These signals are converted by the code generator 302 into corresponding trigger signals for leading and trailing waveform edges, e.g., C1_TR_LEAD, C2_TR_LEAD, C3_TR_LEAD, C4_TR_LEAD, ROW_TR_LEAD, COL_TR_LEAD, REF_TR_LEAD, DOE_TR_LEAD, WD_TR_LEAD, WPB_TR_LEAD, DSTB_TR_LEAD, C1_TR_TRAL, C2_TR_TRAIL, C3_TR_TRAIL, C4_TR_TRAIL, ROW_TR_TRAIL, COL_TR_TRAIL, REF_TR_TRAIL, DOE_TR_TRAIL, WD_TR_TRAIL, WPB_TR_TRAIL, and DSTB_TR_TRAIL, which when set to an active state (e.g., high) indicate that the controlled signals are triggered. The code generator 302 also generates load enable signals, including leading and trailing edge load enable signals such as ROW_LE_LEAD, COL_LE_LEAD, REF_LE_LEAD, DOE_LE_LEAD, WD_LE_LEAD, WPB_LE_LEAD, DSTB_LE_LEAD, C1_LE_LEAD, C2_LE_LEAD, C3_LE_LEAD, C4_LE_LEAD, C5_LEAD, C6_LE_LEAD, C7_LE_LEAD, and C8_LE_LEAD; and ROW_LE_TRAIL, COL_LE_TRAIL, REF_LE_TRAIL, DOE_LE_TRAIL, WD_LE_TRAIL, WPB_LE_TRAIL, DSTB_LE_TRAIL, C1_LE_TRAIL, C2_LE_TRAIL, C3_LE_TRAIL, C4_LE_TRAIL, C5_LE_TRAIL, C6_LE_TRAIL, C7_LE_TRAIL, and C8_LE_TRAIL. The load enable signals are used to indicate that a delay value for a signal group should be loaded. The trigger and load enable signals are stored in predefined locations in the VLIW instruction, along with other command information explained below.

As shown in FIG. 7, a time bar 652 running horizontally near the top of the display window contains the times (e.g., in nanosecond resolution) of signal edges and other events in the waveform editor window 558. The waveforms are created by use of predetermined icons, such as exemplary icons shown in a waveform icon palette 650. To generate the leading and trailing edges of the various signals, icons 600, 602, 604, 606, 608, 610, 612, and 614 can be used. For example, the icons 600 and 602 can both create the rising edge of a signal, while icons 604 and 606 can both create the falling edge of a signal. For non-inverted signals icons 600 and 602 represent leading edges while for inverted signals they represent trailing edges. Similarly, icons 604 and 606 represent trailing edges for non-inverted signals and leading edges for inverted signals. Icon 608 is used to create a high pulse, while icon 610 is used to create a low pulse. Finally, icons 612 and 614 are used to create level low and high signals, respectively.

In addition, icons for defining specific events can be used, such as the following: a force address icon 616 for creating the force address, that is, the address that is placed on the address bus to the UUTs 130, 132 before and after a valid address time period; a row address icon 618 for generating a valid row address; and a column address icon 620 for generating a valid column address. In addition, two icons are provided to generate row and column pseudo-random addresses (icons 622 and 624). A refresh icon 626 is used to define a refresh event.

Other event icons include a column pseudo-random generator icon 624, a row pseudo-random generator icon 626, an update icon 628, an exception icon 630, a write icon 632, a load icon 634, and a loop icon 636. Each of the row or column pseudo-random generator icons invoke events that activate the pseudo-random generators in the address FPGA 252. The exception icon 630 specifies one of several exception events that are generated to interrupt execution of instructions. For example, one exception is to interrupt the address sequence specified by the VLIW instructions to cause the microsequencer 251 in the ACS 124 to jump to another address location.

The update icon 628 specifies an update event in which a register in the ACE 124 is updated. The write data icon 632 specifies a write event in which data bits generated by the data boards 114, 118 are inverted before they are written to one or more UUTs 130, 132. The load icon 628 specifies a load event for loading data into specified registers in the ACB 124. The loop icon 636 specifies a loop event. For example, in the waveform display palette 560, the lines 654 and 656 specify the region in which looping is to occur. The test loops through the specified waveform edges and events in the loop region until an exception is enabled (such as exception event 658) that causes the microsequencer 251 to jump outside the loop region. For example, the exception event 658 can indicate that the jump occurs after the column address increments past a certain value.

Icons 638, 640, 642, 644, and 646 are also provided to generate clocks of predetermined frequencies, such as clocks that run between 50 and 100 MHz.

Each of the waveforms and other events entered into the waveform editor 300 has an associated data structure. The information entered into the waveform editor 300 is typically in the form of edge values (leading edge or trailing edge values) associated with particular times and other events associated with particular times. The data structures representing the waveform edges and other events are converted by the code generator 302 into a VLIW instruction, with associated timings adjusted to take into account a calibration table stored in the storage medium of the host system 100 and/or in memory devices on the data boards 114, 118, the ACB 124, or the tester processor 126. The VLIW instructions are provided as a sequence by the code generator 302 to the tester processor 126 in the tester system 10. In turn, the instruction sequence is transferred to the microsequencer 251 in the ACB 124.

Figure 8:
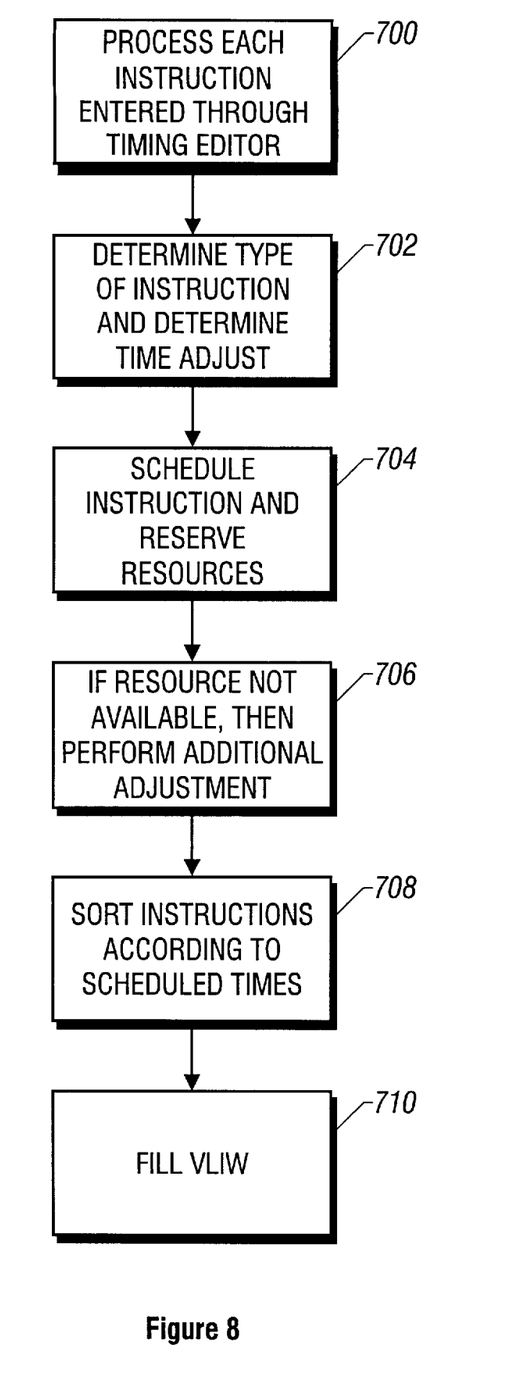
FIG. 8 is a flow diagram of a code generator in the main test program.

Referring to FIG. 8, the general flow of the code generator 302 is explained. The code generator 302 begins first by processing each entry made in the waveform editor 300 (step 700). As each entry is parsed, the code generator determines the type of command (signal edge or other event) and the time in which the microsequencer (in the ACB 124) would like to see the effects of the command at the point of the UUTs 130, 132 (step 302). Thus, any time compensation required due to latencies associated with a particular instruction type or associated with hardware delays (due to variations in skewing and propagation delays of signals connected to the UUTs) is made (step 702).

The code generator 302 then determines the latest possible time that the command must be scheduled in the instruction stream for the desired event to take place and reserves all resources (bits in the VLIW instruction or one of the PPGs 256) that are required for the signal edge or other event (step 704). If a multiplexed resource is not available (because another command has already taken up the resource), the code generator pushes the time of the given command back one clock cycle at a time until the required resources are all available (step 706). The code generator then associates this time with the given command. The result of this operation is a collection of commands each associated with a given time. These commands are then sorted depending on their scheduled time and then grouped according to those times (step 708).

Next, the code generator 302 uses the sorted array of commands to fill the VLIW instruction for each clock cycle. This VLIW instruction word is provided by the code generator and the host to the tester processor 126, which in turn forwards the VLIW instruction to the ACB 124 (step 710).

Figure 9:
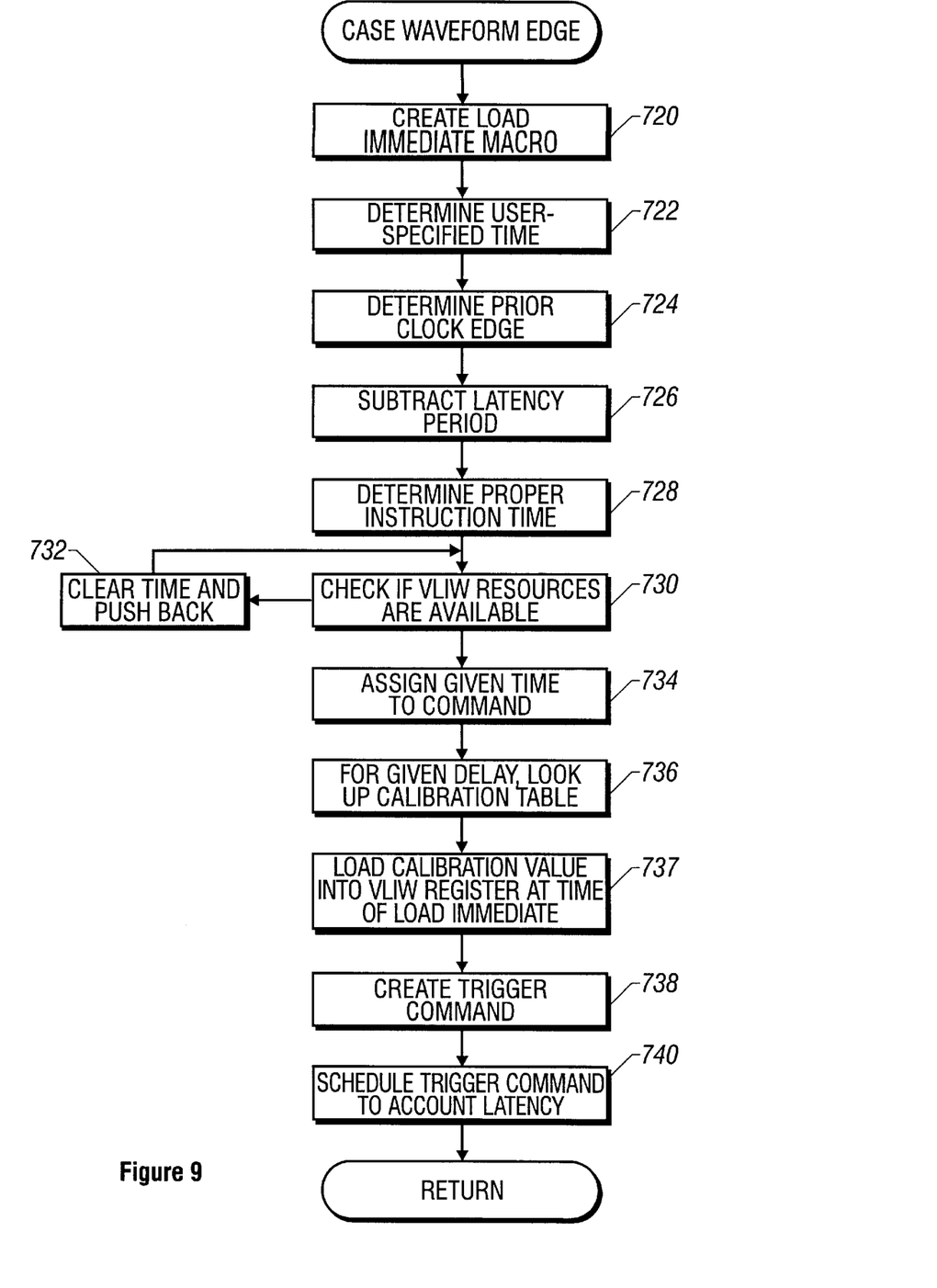
FIG. 9 is a flow diagram of steps performed by the code generator to process a signal edge entered into the waveform editor.
Figure 10:
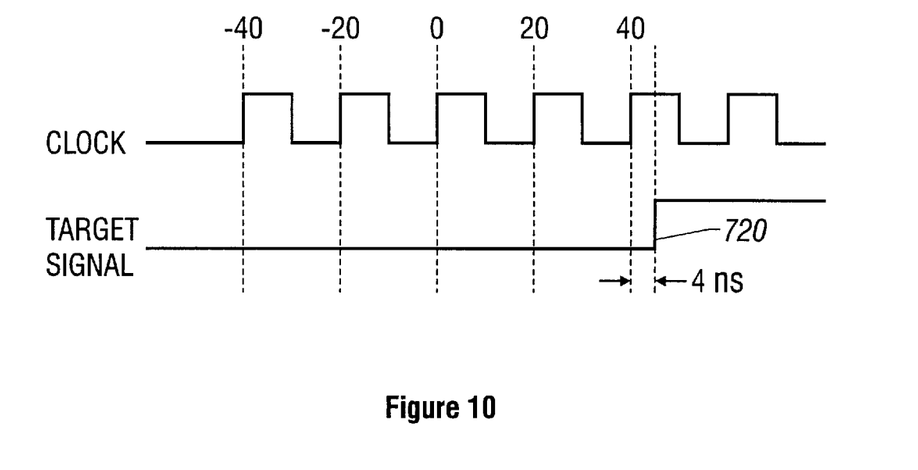
FIG. 10 is a timing diagram of a target signal and a clock in the tester system.

Referring to FIGS. 9 and 10, the steps of the code generator 302 are discussed in more detail when it decodes a waveform edge (such as edge 720 in FIG. 10). In the example illustrated, the clock is running at about 50 MHz. The time axis starts at −40 nanoseconds (ns) and increments in 20-ns periods. A target signal switching time (the relative time desired for the signal to switch at the UUT) is at about 44 ns. Two considerations are needed to create the necessary instruction codes for causing the signal to switch at the desired time. First, any timing delay in the signal path is compensated for; and second, the latency associated with execution of the instruction codes corresponding to the switching edges in the waveform is compensated for.

Upon decoding a waveform edge in the editor 300, a load immediate command is created by the code generator 302 (step 720) to generate the appropriate load enable commands (e.g., C1L_EN, C2L_EN, etc.) in the VLIW instruction to enable loading of appropriate delay registers in the PPG 256. Next, the code generator 302 determines (step 722) the user-specified switch time (which in the example is 44 ns). The user-specified switch time may not fall on a clock edge; as a result, the code generator 302 determines the active edge of the clock immediately preceding the switch time (step 724). In the example of FIG. 10, the rising edge of the prior clock is at 40 ns.

Next, the required latency period for a load immediate command (in one embodiment 40 ns) is subtracted from the identified clock edge (step 726). As a result, the load immediate command is scheduled at 0 ns to compensate for the scheduling latency of the load immediate command. The compensated schedule time is examined (step 728), and the code generator 302 then determines if all resources in the VLIW instruction are available (step 730). If not, the scheduled time is cleared and the code generator 302 goes back another clock period (step 732). However, if the VLIW resources are available to the current command, then the given scheduled time in assigned to the present load immediate command.

Next, the code generator 302 looks up the calibration table 306 to determine how much delay needs to be programmed to account for the 4-ns time difference between the desired signal edge and the clock edge (step 736). The calibration values are loaded into a VLIW register as part of the load immediate command (step 737). This process is described in further detail below in connection with FIG. 12, Next, a trigger command is created (step 738) to indicate when the particular signal should be triggered. The time delay calculated above is loaded with the trigger command into a field in the VLIW instruction. Because the trigger command is also associated with a latency from scheduling to execution, that latency is determined and the trigger command scheduled accordingly (step 740). In the example shown in FIG. 10, the trigger command's latency is about 20 ns, and as a result, the trigger command is scheduled at the 20-ns point. Next, the code generator 302 returns to the main routine.

Figure 14:
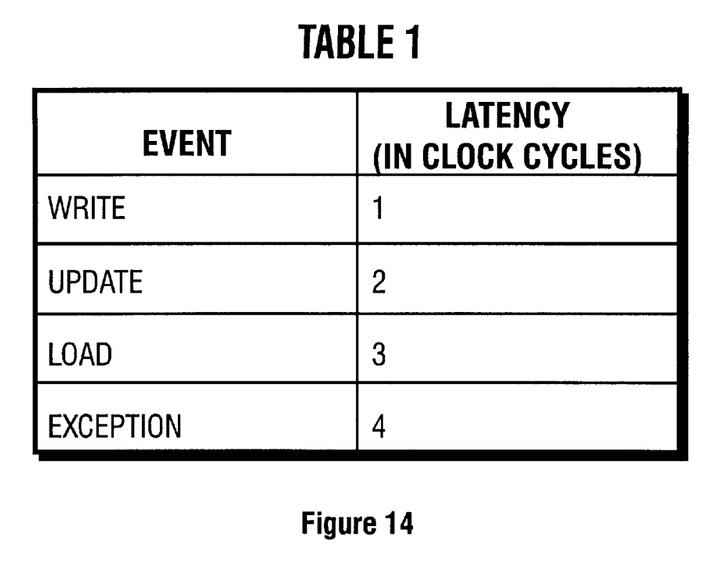
FIG. 14 is a table illustrating latencies associated with different events in the tester system.

The other events, such as update, exception, write, load, and loop, do not involve accessing of the UUTs. Thus, with those events, the code generator 302 sets the appropriate bit or bits in the VLIW instruction. As with the load immediate command, the scheduling latency for these events must also be accounted for. The latency of the events are shown below in Table 1 in FIG. 14.

Figure 12:
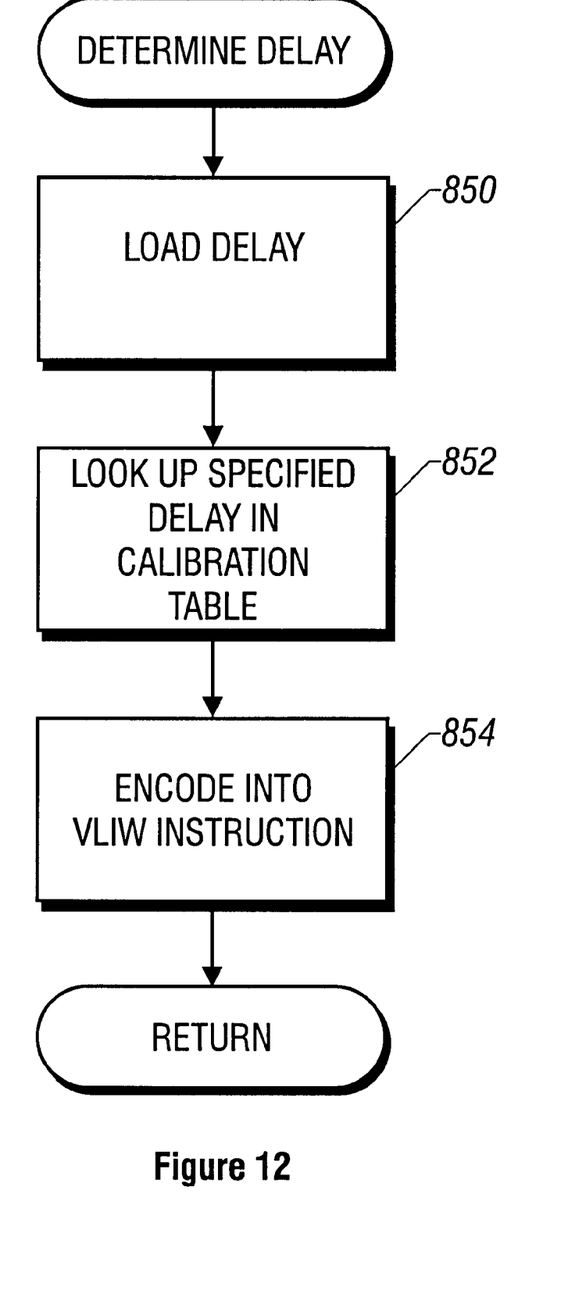
FIG. 12 is a flow diagram of steps performed by the code generator to determine delay associated with a particular signal.

Referring to FIG. 12, the flow of the code generator 302 for determining the required delay for a particular signal is described. The code generator 302 first loads the delay (delay between a clock edge and the desired signal transition) derived from the wave editor program 300 (step 850). Next, the code generator 302 looks up the specified delay for the signal in the calibration table 306, which is organized by signal name, amount of specified delay (identified in waveform editor), clock frequency, and operating voltage. The specified delay is mapped to an entry in the calibration table. Thus, for example, a specified delay of 4 ns may map to an actual delay of about 30 ns. Other specified delays map to other actual delay values, and the relationship between specified delays and actual delays are not necessarily linear.

The mapping stored in the calibration table 306 is derived by use of an external calibration device that obtains the necessary calibration data for different signals and operating conditions. Once measured and calculated, the calibration data is stored in the calibration table 306 for use by the tester system 10.

After the actual delay value is obtained from the calibration table 306, the delay value is written to the delay field in the VLIW instruction. The delay value is used to program the delay of the programmable pulse generators 256 in the ACB 124, as explained below.

Figure 11:
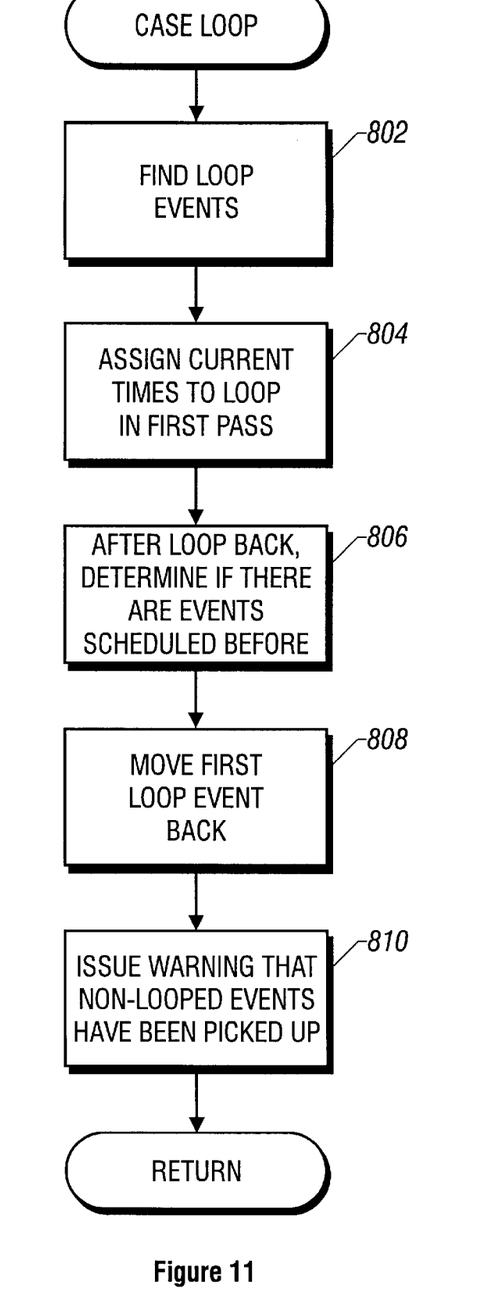
FIG. 11 is flow diagram of steps performed by the code generator to process a loop event entered into the waveform editor.

Referring to FIG. 11, the flow of the code generator 302 for a loop event is shown. As illustrated in FIG. 7, a loop region is defined between lines 654 and 656. The code generator 302 first identifies these loop events (step 802). In the first pass through the loop region, the events are scheduled as above and the times corresponding to the loop events 654 and 656 are the times shown in the wave display 652 (step 804). When the code generator 302 reaches line 656, control jumps back to line 654. As there are events that may have been scheduled by the code generator 302 to occur before the first loop event 654 due to latencies associated with those events, such events may be missed in the second and subsequent passes through the loop region.

For example, in FIG. 7, the exception event 658 is shown in the display 560 to be scheduled in the loop region. However, the code generator 302 actually schedules the exception event before the first loop event due to scheduling latency. If such events ate detected by the code generator (step 806), the first loop event 654 is moved back in time to expand the loop region to include such events (step 808).

Expanding the loop region, may however, cause non-looped events to be included in the loop. If this happens, the code generator 302 issues a warning (step 810). In response to the warning, the user can modify the scheduling of waveforms and other events to avoid this condition.

In another embodiment, the loop position times are not adjusted. Instead, events that should occur inside the loop but must be scheduled prior to the loop's start are examined to determine if a separate, second invocation at the end of the loop is also possible. The second invocation effectively places the event inside the loop for subsequent iterations. For example, an update event that occurs at the start of a loop must normally issue two clock cycles prior to the start of the loop according to Table 1 of FIG. 14. Thus the update will only occur once; during the first loop iteration. Placing an additional update event at two clock cycles before the end of the loop, however, results in the update event being present at the start of each subsequent loop cycle.

Figure 13:
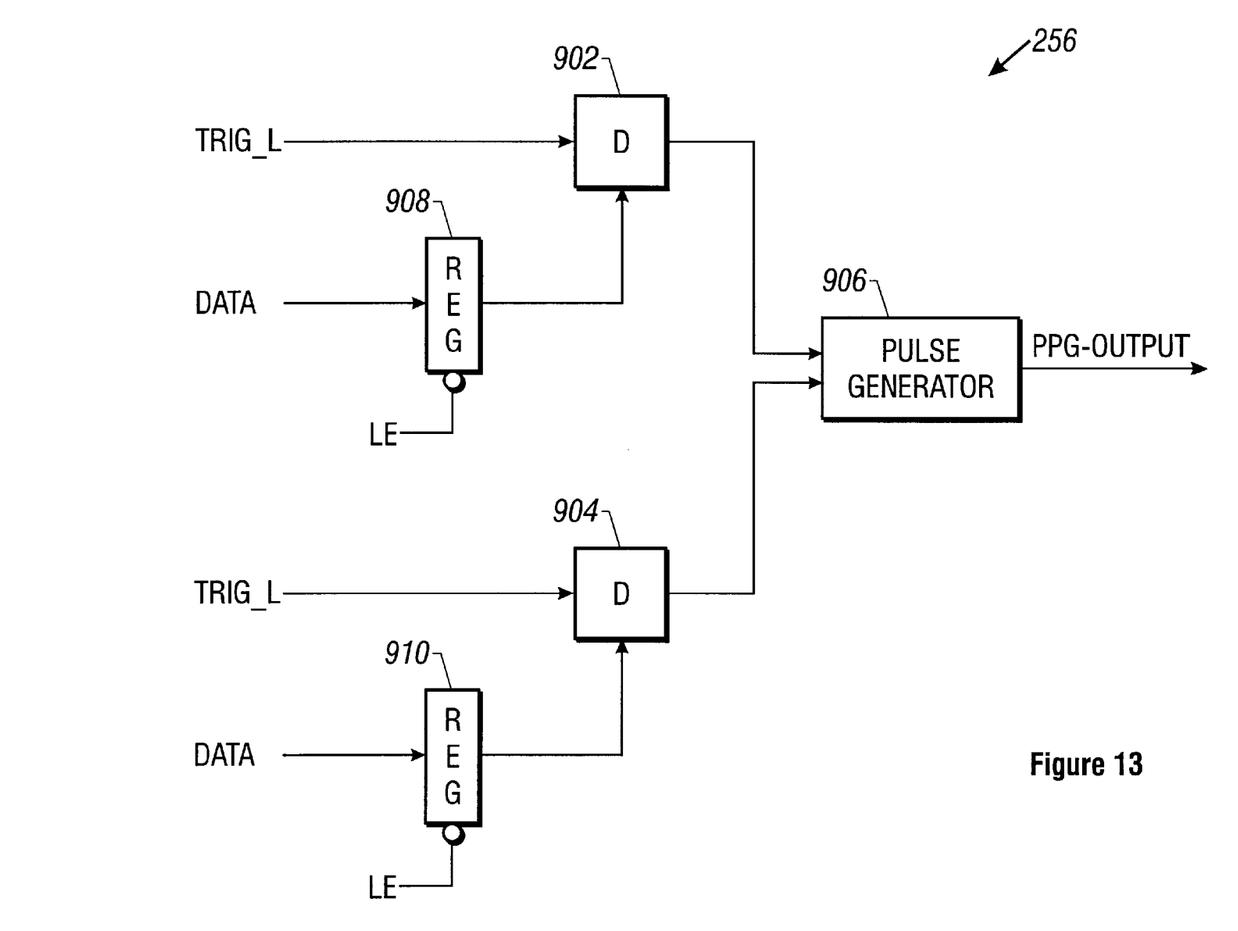
FIG. 13 is a block diagram of a programmable pulse generator in the address control board of FIG. 4.

Referring to FIG. 13, a logic diagram of a programmable pulse generator (PPG) 256 is illustrated. A bank of these PPGs are included on the ACB 124. In one embodiment, 16 PPGs are included, with 8 used for controlling the timing of UUT control signals, five used for UUT data signals, one used for row address signals, one used for column address signals, and one used for other miscellaneous control signals. The PPGs 256 can be implemented in an ASIC. Alternatively, they can be implemented as discrete devices or other suitable programmable logic.

Each PPG 256 includes a pulse generator 906 that generates a pulse based on an input (either TRIG_L for the leading edge of the signal or TRIG_T for the trailing edge of the signal). The TRIG_L and TRIG_T signals are derived in the microsequencer 251 from the VLIW instruction. The pulse generator 906 receives at its inputs the outputs of delay elements 902 and 904, which receive signals TPIG_L and TRIG_T, respectively. In one embodiment, these delay elements 902 and 904 include multiple gates that are selectively controlled by an input value to provide different delays. Each gate provides predetermined propagation delays according to predetermined operating conditions (e.g., voltage, frequency). In one embodiment, a gate provides a propagation delay that is approximately 0.5 ns, depending upon the operating conditions. Thus, the delay element 902 or 904 can control the delay of the TRIG_L or TRIG_T signal down to whatever resolution is provided by its gate components. The delays are calibrated and stored in the calibration table 306.

The delay values for controlling the delay elements 902 and 904 are provided by registers 908 and 910, respectively, which are loaded with the delay value when the load enable signal LE (corresponding to one of the C1L_LE, C1T_LE, C2L_LE, etc., signals) is driven low. The delay data is latched in the register 902 or 904 when the signal LE is activated high. The registers 902 and 904 can be programmed, again from the VLIW instruction, to provide a delay in increments of what time delay can be provided by each gate in the delay elements 902 and 904.

Thus, under control of the main test program 12 in the host system 100, UUT signals can be individually-controlled such that any timing variations are reduced or eliminated.

Other embodiments are within the scope of the following claims. For example, although a specific tester system hardware configuration is shown, other tester system configurations are also contemplated. Furthermore, the software layers can be rearranged or combined, and the order of the steps of each of the programs can be changed and still achieve desirable results. In addition, the waveform editor can be a non-graphical user interface.

Although the present invention has been described with reference to specific exemplary embodiments, various modifications and variations may be made to these embodiments without departing from the spirit and scope of the invention as set forth in the claims.

What is claimed is:

1. A tester for use with a device under test, comprising:
   a processor;
   a signal timing editor to create representations of signal waveforms and associated times; and
   a test program executable on the processor that schedules events based on information from the signal timing editor,
   wherein the test-program schedules different delays for the events to compensate for variations in time delays between different signals coupled to the device under test.

2. The tester of claim 1, wherein variations of the delays of the signals are associated with variations in hardware connections in the tester.

3. The tester of claim 1, wherein the signal timing editor includes a graphical user interface.

4. The tester of claim 1, further comprising a storage medium in which calibration data can be stored, wherein the calibration data is accessible by the test program to perform the time compensation of the different signals.

5. The tester of claim 1, wherein the events are associated with signal edges defined in the signal timing editor.

6. The tester of claim 1, wherein the events are associated with special events defined in the signal timing editor.

7. The tester of claim 1, further comprising:
   a controller programmable by the test program to perform test cycles.

8. The tester of claim 7, wherein the test program creates instruction words that control the controller.

9. The tester of claim 8, wherein the controller includes a storage medium for storing the instruction words.

10. The tester of claim 6, wherein the controller includes a microsequencer having a static random access memory and a programmable pulse generator.

11. The tester of claim 1, further comprising a controller to generate control signals to the device under test, wherein the test program generates an instruction word that is executable by the controller.

12. The tester of claim 11, wherein the instruction word includes a collection of commands executable to generate a sequence of control signals to the device under test.

13. A method of testing a device under test in a tester system, comprising:
   receiving information representing a test waveform for the device under test, the information including different instructions;
   scheduling events for the device under test based on the instructions received; and
   executing a test program to compensate for the variations in timing delays of signals coupled to the device under test.

14. The method of claim 13, wherein the test waveform information is received from a waveform editor.

15. The method of claim 13, wherein the executing step includes accessing a table containing calibration data and determining the amount of delay for each particular signal.

16. The method of claim 13, wherein the executing step includes loading a delay value into a signal generator that controls timing of a particular signal.

17. The method of claim 13, wherein the tester includes a controller that controls timings of signals in the tester system, the method further comprising generating commands for the controller.

18. A storage medium for storing a test program executable by a test system to control a device under test, the test program comprising instructions for causing the test system to:

receive a test sequence;

schedule events associated with steps in the test sequence; and adjust times associated with the events to compensate for latency between generation of the event and a corresponding receipt of the event by the device under test.

19. The storage medium of claim 18, wherein the test program further comprises instructions for causing the test system to present a waveform editor in which a test sequence can be generated.

20. A storage medium for storing a test program executable by a test system to control a device under test, the test program comprising instructions for causing the test system to:

receive a test sequence containing timings of edges for test signals;

schedule events associated with the test signal edges;

access a table containing calibration data to determine delays for the test-signal edges; and adjust timings of the test signal edges using the determined delays.

21. The storage medium of claim 20, wherein the test program further comprises instructions for causing the test system to load delay values determined from the calibration data into signal generators that control timings of particular signals.

22. A method of testing a device in a test system, the method comprising:

receiving through a user interface a test sequence;

converting the test sequence into a series of instructions; and accessing calibration information to adjust times associated with the test sequence to compensate for variations in signal timing paths to the device under test.

23. The method of claim 22, wherein the method further comprises determining delay values of signal timing paths from the calibration information and loading the delay values into signal generators that control particular signals in the test system.

24. A test system for testing a device under test, comprising:

a signal generator that controls timing of signals to the device under test; and a host system having a storage device in which calibration data is stored and a processor on which a test program is executed, the test program including:

a waveform editor in which a test sequence for the device signals is created; and a converter that accesses the calibration data to determine delays associated with the test signals and loading the delays into the signal generator.

25. The test system of claim 24, further comprising at least one additional signal-generator, wherein each signal generator is separately programmable by the test program to control different groups of device signals.

26. The test system of claim 24, further comprising a controller operatively coupled to the signal generator, wherein the test program further creates an instruction word containing commands that control the controller.

* * * * *